United States Patent
Sugimoto et al.

(10) Patent No.: US 6,653,780 B2
(45) Date of Patent: Nov. 25, 2003

(54) LUMINESCENT DISPLAY DEVICE AND METHOD OF MANUFACTURING SAME

(75) Inventors: Akira Sugimoto, Tsurugashima (JP); Kenichi Nagayama, Tsurugashima (JP); Toshiyuki Miyadera, Tsurugashima (JP); Ayako Yoshida, Tsurugashima (JP); Satoshi Miyaguchi, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/138,302

(22) Filed: May 6, 2002

(65) Prior Publication Data

US 2003/0062828 A1 Apr. 3, 2003

(30) Foreign Application Priority Data

May 11, 2001 (JP) ........................................ 2001-142066

(51) Int. Cl.⁷ .................................................... H01J 1/62
(52) U.S. Cl. ...................................................... 313/506
(58) Field of Search ................................. 313/491, 498, 313/503, 506, 512

Primary Examiner—Vip Patel
(74) Attorney, Agent, or Firm—Sughrue Mion, PLLC

(57) ABSTRACT

A luminescent display device comprises a resin substrate having one and another surfaces, and a transparent electrode, a metal auxiliary electrode disposed to be conductive to the transparent electrode and a luminescent layer composed of an organic compound so that the transparent electrode, the auxiliary electrode and the luminescent layer are laminated in form of layers on the one surface of the resin substrate. The auxiliary electrode has a total stress of {(inner stress)× (film thickness thereof)} of not more than $1.3\times10^5$ dyn/cm.

10 Claims, 5 Drawing Sheets

LUMINESCENT DISPLAY DEVICE AND METHOD OF MANUFACTURING SAME

BACKGROUND OF THE INVENTION

The present invention relates to a luminescent display device including a transparent substrate, particularly formed of resin substrate, and a transparent electrode, an auxiliary electrode and a luminescent layer which are laminated on the substrate and also relates to a method of manufacturing such a luminescent display device.

In general, there is known an organic EL (electroluminescent or electroluminescent) display element, which is composed of a transparent electrode in shape of stripe laminated on a transparent substrate formed of, for example, glass, a luminescent layer made of an organic compound and laminated on the transparent electrode, and a metal electrode in shape of stripe laminated on the luminescent layer so as to be perpendicular to the transparent electrode. The transparent electrode is formed as an anode and the metal electrode is formed as a cathode, and when direct current (DC) field is applied between the transparent electrode and the metal electrode, the current passes through the organic compound and, hence, the luminescent layer is emitted. The light emitted from the luminescent layer is taken out from the transparent electrode side.

A resin substrate is used in place of the glass substrate for the purpose of making the thickness of the organic EL display device thin. The use of the resin substrate can make the thickness of the substrate itself thin and hardly cracked. And an organic EL display device utilizing the resin substrate can be bent, thus being advantageous.

However, in the case of using the resin substrate, it is necessary to form a moisture-proof layer on the resin substrate because the luminescent layer formed of an organic compound is weak to moisture (water content) and the water content passes through the resin substrate.

Further, electric current passes through the organic compound laminated on the resin substrate, and when the current passes, it becomes necessary to pay attention to a resistance of the transparent electrode. That is, the metal electrode has a low resistance and, on the other hand, the transparent electrode made of an oxide has a resistance higher than that of the metal electrode. Accordingly, the resistance of the transparent electrode becomes significant as the current passes the organic compound.

When the resistance increases, there may cause a case that the adequate field is not applied to the organic compound as being apart from a connection portion to a circuit, which results in an uneven luminescence between a plurality of organic compounds, thus being inconvenient and defective. In order to solve such defect, there is provided a technology for disposing an auxiliary electrode. That is, a metal auxiliary electrode is disposed on the side of the transparent electrode so as to be conductive thereto to reduce wiring resistance on an anode side.

FIG. 6 represents steps for preparing an organic EL element on a resin substrate as a substrate. That is, a resin substrate 1 is prepared and a moisture-proof 5 is laminated on one surface of the resin substrate 1 (step S1). A transparent electrode 2 as anode is formed, in form of film, on the moisture-proof layer 5 (step S2), and the thus laminated transparent electrode 2 is then subjected to a patterning treatment or process (step S3). Next, a metal thin film is formed as an auxiliary electrode 3 on the transparent electrode 3 (step S4). This metal thin film is thereafter subjected to the patterning treatment (step S5).

It will easily be assumed that the formation of the auxiliary electrode is needed at a time of manufacturing a luminescent display device using the resin substrate. The following problem or defect will be caused, however, at the time of forming the metal thin film on the resin substrate 1 as the auxiliary electrode 3.

That is, since the resin substrate 1 is softer in material than the glass substrate (i.e. smaller Young's module), the resin substrate 1 was largely bowed, as shown in step S4 in FIG. 6, at the time of forming the metal thin film, which adversely influences a subsequent processes or steps including the patterning treatment of the metal thin film.

Furthermore, when the metal thin film is formed on the resin substrate 1, there may cause a case that crack 9 is formed to the moisture-proof layer 5 or the layer of the transparent electrode 2, which may then be damaged of broken. In the case of breaking the moisture-proof layer 5, harmful water content will intrude into the luminescent layer, and hence, it may become difficult to preserve the luminescent layer in good state.

SUMMARY OF THE INVENTION

An object of the present invention is therefore to substantially eliminate defects or drawbacks encountered in the prior art mentioned above and to provide a luminescent display device in which, at a time of forming an auxiliary electrode on a resin substrate, a warpage or bowing of the resin substrate can be prevented and the moisture-proof layer and/or transparent electrode is free from being damaged, and also provide a method of manufacturing such luminescent display device.

In order to achieve the above and other objects, the inventors viewed a point that inner stress always remains in a thin film formed on the resin substrate through vacuum evaporation, spattering, epitaxial growth or like process or treatment, and the warpage of the resin substrate and/or damage of the moisture-proof layer is resulted from the remaining inner stress. The inner stress $\sigma(\text{dyn/cm}^2)$ in the metal film is a force, per unit sectional area, which is applied from one side of the sectional area to the other side thereof. The inventors also found that the above defect or damage at the time of forming the auxiliary electrode on the resin substrate could be solved by reducing the total stress $S = \sigma \times d(\text{dyn/cm})$ ($\sigma$: inner stress; $d$: film thickness) to a predetermined value.

Taking the above matters into consideration, inventors of the subject application achieved the above and other objects according to the present invention by providing, in one aspect, a luminescent display device comprising a resin substrate having one and another surfaces, and a transparent electrode, a metal auxiliary electrode disposed to be conductive to the transparent electrode and a luminescent layer composed of an organic compound, the transparent electrode, the auxiliary electrode and the luminescent layer being laminated in form of layers on the one surface of the resin substrate, wherein the auxiliary electrode has a total stress of {(inner stress)×(film thickness thereof)} of not more than $1.3 \times 10^5$ dyn/cm.

Hereunder, the reason why the total stress of the auxiliary electrode was decided to be not more than $1.3 \times 10^5$ dyn/cm in the above aspect of the present invention will be explained.

The relationship between the inner stress $\sigma$ of the auxiliary electrode and a radius of curvature r of the warpage of the resin substrate is expressed by the following equation (1)

in view of balancing between a force and moment of a minute (fine) portion of the substrate:

$$r = E \cdot b^2 / \{6(1-v) d \cdot \sigma\}$$

$$\sigma = E \cdot b^2 / \{6(1-v) d \cdot r\} \quad (1)$$

(r: radius of curvature of warpage of substrate; E: Young's modulus of substrate; b: thickness of substrate; v: Poisson's ratio of substrate; d: film thickness of auxiliary electrode; σ: stress of auxiliary electrode)

In the case of the resin substrate, though being different in materials which form the substrates, approximately, Young's modulus=10000 to 20000 kgf/cm$^2$ and Poisson's ratio=0.4 to 0.5. The inventors of the subject application evaluated warpage amount and cracks of barrier layer (moisture-proof layer) at a time of forming chromium films of the thicknesses described in the following Table 1 by using a usual resin substrate having a thickness of 0.2 mm and length of 100 mm.

TABLE 1

| Film Thickness (Å) | Warpage (mm) | Evaluation of Crack to Barrier Layer | Total Stress (dyn/cm) |
| --- | --- | --- | --- |
| 500 | 5.5 | good | — |
| 800 | 8.0 | good | — |
| 1000 | 9.5 | not good | 1.5 × 10$^5$ |
| 1500 | 12 | not good | — |

As can be seen from this Table 1, in the case of using the usually known resin substrate having a thickness of 0.2 mm, it is required for the substrate to have a warpage amount of not more than 8 mm with respect to the substrate having a length of 100 mm, and on the contrary, in the case of exceeding this value of 8 mm, the moisture-proof layer (barrier layer) will be much damaged and other defects due to a large warpage will be caused in subsequent processes. According to this matter, the total stress of the thin film of the auxiliary electrode will be calculated, and in the above case, the radius of curvature r becomes 155 mm (r=155 mm). Accordingly, the total stress will be calculated by applying this value to the above equation (1). For example, in the case of r=155 mm, E=15000 gf/cm$^2$, v=0.5, 1 kgf≈10$^6$ dyn/cm$^2$, $$\sigma \cdot d(dyn/\text{cm}) = \{15000 \times 9.8 \times 10^5 \times (2 \times 10^{-2})^2\} / \{6 \times (1-0.5) \times 15.5\} = 1.5 \times 9.8 \times 4 \times 10^5 / (6 \times 0.5 \times 15.5) = 1.26 \times 10^5 \approx 1.3 \times 10^5$$

By forming the metal film so that the total stress becomes less than the above calculated value, the auxiliary electrode in form of metal film can be formed on the resin substrate without problem. Further, the inner stress may be a tensile stress in a pulling direction of a force acting to an object through a unit sectional area perpendicular to the substrate surface (i.e. a stress applied at a time of a film being shrunk) or may be a compressive stress in a pushing direction thereof (i.e. a stress applied at a time of a film being spread).

In preferred embodiments of the above aspect, a moisture-proof layer is disposed between the resin substrate and the transparent electrode so as to shut out moisture. The auxiliary electrode is disposed between the resin substrate and a portion of the transparent electrode.

A layer of metal oxide may be formed between the resin substrate and the auxiliary electrode.

In a conventional art, as shown in steps S2 to S5 of FIG. 6, the transparent electrode 2 is formed in form of film and then patterned, and thereafter, the auxiliary electrode 3 is formed and then patterned so as to contact the side surface of the transparent electrode 2. In such steps, in a case where the transparent electrode 2 is formed at a high temperature of more than 200° C. for a glass substrate, no problem will be provided, but the transparent electrode 2 formed at a low temperature for a resin substrate is eroded by an etching solution at the patterning treatment of the auxiliary electrode 3 such as shown in FIG. 8. Therefore, the surface of the transparent electrode 2 is made coarse, which influences the luminescence condition of the luminescent layer.

This defect can be overcome by the present invention, in which the transparent electrode is formed and patterned after the formation and patterning of the auxiliary electrode (that is, the auxiliary electrode is disposed between the resin substrate and a portion of the transparent electrode). Therefore, the transparent electrode cannot be eroded by the etching solution at the patterning of the auxiliary electrode. For this reason, the surface of the transparent electrode can be kept smooth and fine luminescence condition can be maintained. Furthermore, since the metal auxiliary electrode is covered by the transparent electrode, the oxidation of the metal auxiliary electrode can be prevented.

Furthermore, according to the formation of the metal oxide, such as indium-tin oxide, a layer between the resin substrate and the auxiliary electrode, can provide good adhesion to the metal film of the auxiliary electrode. Further, in a case where the auxiliary electrode is directly formed on the resin substrate, there is a fear of the auxiliary electrode being peeled from the resin substrate.

In another aspect, there is provided a luminescent display device comprising a resin substrate having one and another surfaces, and a transparent electrode, a metal auxiliary electrode disposed to be conductive to the transparent electrode and a luminescent layer composed of an organic compound, the transparent electrode, the auxiliary electrode and the luminescent layer being laminated in form of layers on the one surface of the resin substrate, wherein the auxiliary electrode is formed of silver or silver alloy in form of film having a thickness of not more than 500 nm.

In a further aspect, there is provided a luminescent display device comprising a resin substrate having one and another surfaces, and a transparent electrode, a metal auxiliary electrode disposed to be conductive to the transparent electrode and a luminescent layer composed of an organic compound, the transparent electrode, the auxiliary electrode and the luminescent layer being laminated in form of layers on the one surface of the resin substrate, wherein the auxiliary electrode is formed of aluminium in form of film having a thickness of not more than 150 nm.

Furthermore, in a further aspect, the above and other objects can be achieved by providing a method of manufacturing a luminescent display device comprising the steps of:

preparing a resin substrate having one and another surfaces; and laminating, on the resin substrate, a transparent electrode, an auxiliary electrode made of metal to be conductive to the transparent electrode and a luminescent layer composed of an organic compound;

wherein the auxiliary electrode is formed of metal in form of film having a total stress of {(inner stress)×(film thickness thereof)} which is not more than 1.3×10$^5$ dyn/cm.

In a preferred embodiment of this aspect, the transparent electrode is laminated after the lamination of the auxiliary electrode. The method may further comprise a step of laminating a metal oxide on the one surface of the resin substrate before the formation of the auxiliary electrode.

The auxiliary electrode is formed through either one of treatments or processes of vacuum evaporation, spattering, ion-plating or epitaxial growth and is then subjected to a patterning treatment.

According to such manufacturing method, substantially the same advantageous merits as those mentioned above can be achieved.

The nature and further characteristic features of the present invention will be made more clear from the following descriptions made with reference to the accompanying drawings.

DESCRIPTION OF THE PREFERRED EMBODIMENTS

The present invention will be described hereunder with reference to the accompanying drawings.

Figure 1:
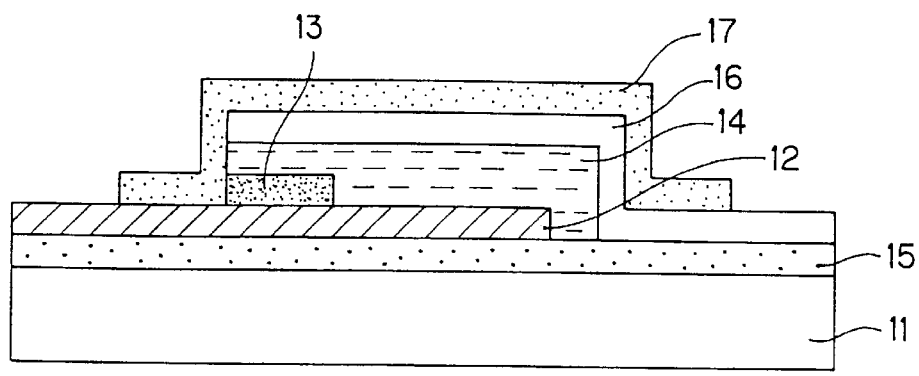
FIG. 1 is a sectional view showing a luminescent display device according to a first embodiment of the present invention.

Referring to FIG. 1 showing the first embodiment of a luminescent display device of the present invention, the luminescent display device comprises a resin substrate 11 and a laminated structure of an organic EL element which comprises a layer composed of a transparent electrode 12 formed on the resin substrate, an auxiliary electrode 13 of conductive metal material and a luminescent layer 14 composed of an organic compound.

In the present embodiment, the resin substrate 11 has a transparent or translucent (semi-transparent) property with respect to a visible light and has, for example, a thickness of 0.2 mm. The resin substrate 11 is formed, on at least one surface thereof, with a moisture-proof layer 15 shutting out moisture or water content. Such resin substrate 11 may preferably be formed from a liquid crystal substrate having a base material of PC (polycarbonate). However, the material and thickness of the resin substrate 11 are not limited to the above ones for the present invention. It is, however, desirable to use the substrate material, other than the resin substrate mentioned above, having Young's modulus, Poisson's ratio and thickness of values near those of the above resin substrate in consideration of merits or advantages due to the usage of the resin substrate such that the resin substrate can be made thin and can be bent.

On a display area of this one surface of the resin substrate 11, is disposed the transparent electrode 12 in form of film as an anode. The transparent electrode 12 has transparent or translucent property with respect to visual light, and for example, is formed of a conductive material such as an oxide of indium-tin, an oxide of indium-zinc, or like. Such transparent electrode 12 is formed by first forming a thin film of oxide through vacuum evaporation, spattering, ion-plating or epitaxial growth treatment or process, and thereafter, by patterning the thus formed thin film. The thus formed transparent electrode 12 provides a plane of stripe shape.

The metal auxiliary electrode 13 is laminated on the transparent electrode 12 in form of film so as to be electrically conductive thereto and then patterned. The auxiliary electrode 13 is formed by forming a thin metal film through vacuum evaporation, spattering, ion-plating or epitaxial growth treatment or process, and thereafter, the thus formed thin metal film is patterned by utilizing a photolithography technology or like.

The metal thin film is formed so that the total stress S (inner stress $\sigma(dyn/cm^2) \times$ film thickness d) is not more than $1.3 \times 10^5$ dyn/cm. More specifically, in the case that the auxiliary electrode 13 is formed of a silver-palladium-copper alloy or silver alloy, the film thickness is set to be less than 500 nm, and in the case that the auxiliary electrode 13 is formed of an aluminium, the film thickness is set to be less than 150 nm. As the material for the auxiliary electrode 13 other than those mentioned above, there will be listed up Cr, Mo or Cu, and according to the kinds of materials, the total stress S is set to be not more than $1.3 \times 10^5$ dyn/cm. Further, the inner stress of the auxiliary electrode 13 is measured by a strain measuring method of a crystal grid, warpage (bowing) measuring method of the substrate or like method.

The luminescent layer 14 is further formed on the auxiliary electrode 13 by evaporating and spattering an organic compound. The luminescent layer 14 formed of the organic compound may have a single layer structure having only one organic layer or have a multi (plural) layer structure in which a plurality of functions such as luminous function, carrier conveying function or like function are endowed separately to the respective layers.

On the luminescent layer 14, there is further disposed a metal electrode 16 as cathode, which is formed into a film shape and patterned. The metal electrode 16 is formed as a thin metal film so as to provide a stripe shape perpendicular to the transparent electrode 12.

As mentioned above, the organic EL element is composed of the transparent electrode 12, the auxiliary electrode 13, the luminescent layer 14 and the metal electrode 16, which are disposed in this order on one surface (upper surface as viewed in FIG. 1) of the resin substrate 11, and is covered by a seal (sealing) layer 17. The seal layer 17 is formed of a silicon nitride, epoxy resin or like material and disposed for the purpose of shutting out the invasion of moisture or water content in the atmospheric air into the luminescent layer 14.

When a DC field is applied between the anode side (transparent electrode 12) and the cathode side (metal electrode 16), positive holes are poured from the anode into the luminescent layer 14 and electrons are also injected from the cathode thereinto, thereby emitting the organic compound in the luminescent layer 14 and the emitted light is taken out through the other one surface of the resin substrate 11.

Figure 2:
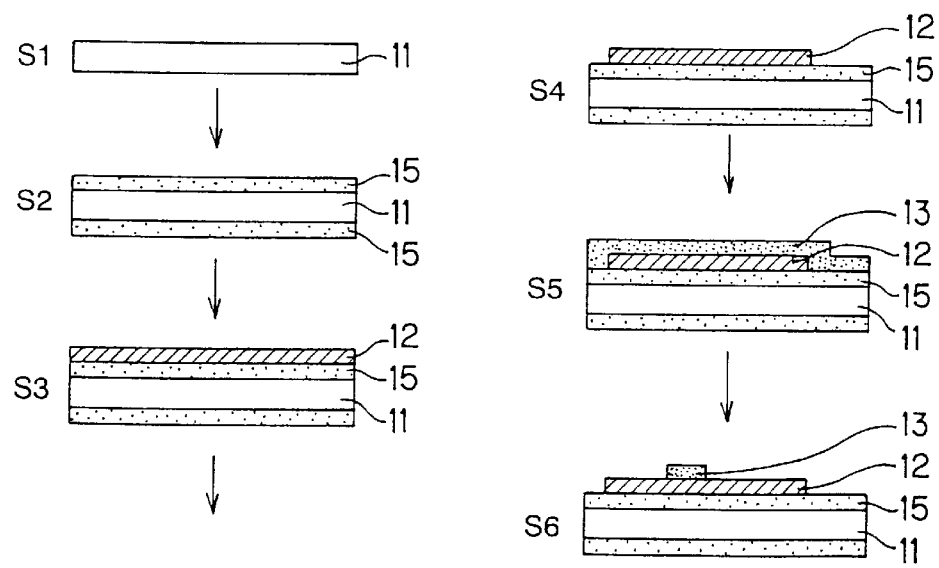
FIG. 2 includes several views representing a series of steps of manufacturing the luminescent display device of FIG. 1.

FIG. 2 includes several views representing the manufacturing steps of the luminescent display device of FIG. 1 of the present invention.

First, the transparent resin substrate 11 is prepared (step S1). In the next step (step S2), a moisture-proof layer 15 is formed in form of film on each of the surfaces of the resin substrate 11 through the evaporation, spattering, ion-plating, epitaxial growth treatment or process, or like. Thereafter, the transparent electrode 12 is formed in form of film on one of the surfaces of the resin substrate 11 through the spattering, ion-plating, epitaxial growth treatment or process, or like (step S3), and in the next step (step S4), the patterning treatment is applied to the transparent electrode 12 (step S4). Next, the auxiliary electrode 13 is then formed in shape of film on one surface of the thus formed transparent electrode 12 through the evaporation, spattering, ion-plating, epitaxial growth treatment or process, or like process (step S55). In the above step, the formation of the auxiliary electrode in form of film is performed at a normal temperature or a temperature slightly higher than the normal temperature, since the resin substrate 11 will soften at a temperature higher than the softening point thereof. In this step, the auxiliary electrode 13 is formed with the total stress S (inner stress $\sigma(dyn/cm^2) \times$ film thickness d) of the metal thin film being not more than $1.3 \times 10^5$ dyn/cm. In the next step (step S6), the patterning treatment is performed to the auxiliary electrode 13 by utilizing the photolithography technology. In the subsequent step, the luminescent layer is formed in form of film by carrying out the evaporation, spattering, spin-coat, screen printing or fine-grain spraying process or treatment to an organic compound. Thereafter, the metal electrode 16 is formed on the luminescent layer 14 by utilizing the evaporation, spattering or photolithography technology.

Figure 3:
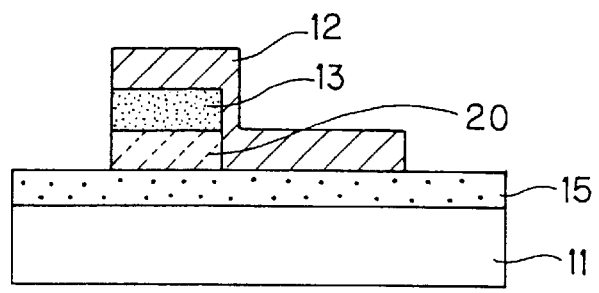
FIG. 3 is a sectional view showing a luminescent display device according to a second embodiment of the present invention.

FIG. 3 is a sectional view representing the second embodiment of the luminescent display device according to the present invention, which shows, for the sake of easy understanding, a state before the lamination of the luminescent layer 14. In this embodiment, since the resin substrate 11 and the moisture-proof layer 15 have the same structures as those of the first embodiment shown in FIG. 1, the details thereof are not described herein by adding the same reference numerals.

In this second embodiment, different from the first embodiment, a metal oxide 20 in form of layer or film is first laminated on the moisture-proof layer 15 which is formed on one surface of the resin substrate 11. Such metal oxide 20 is formed by using, for example, indium-tin oxide. The layer of the metal oxide 20 is formed by first forming a film of an oxide through vacuum evaporation, spattering, ion-plating or epitaxial growth process or treatment and, thereafter, patterning the thus formed oxide film. The patterned metal oxide layer 20 has a surface shape substantially identical to that of the auxiliary electrode 13.

The metal oxide other than indium-tin oxide may be utilized as far as it has transparency and well adhesion to the auxiliary electrode 13. For example, in a case where an oxide containing either one of Sn, Zn and In is used, it is necessary to perform a patterning treatment after the formation of the film (layer) of such oxide because these materials have conductive property. On the other hand, in a case where the metal oxide 20 is formed of an insulating material, it is not necessary to perform such patterning treatment as in the embodiment mentioned above, and in such case, an oxide containing at least one of aluminium (Al), zirconium (Zr), titanium (Ti), calcium (Ca), chromium (Cr), nickel (Ni) and silica (Si) may be utilized.

On the metal oxide 20, is formed the auxiliary electrode 13, in form of film, through vacuum evaporation, spattering, ion-plating or epitaxial growth process or treatment, and then is subjected to the patterning treatment.

In this second embodiment, as in the first embodiment, the formation of the auxiliary electrode in form of metal film is carried out at the total stress S (inner stress $\sigma(dyn/cm^2) \times$ film thickness d) of the metal thin film being not more than $1.3 \times 10^5$ dyn/cm. The auxiliary electrode 13 of this second embodiment is formed of the same material as in the first embodiment and has substantially the same plane shape as that in the first embodiment.

The formation of such metal oxide layer 20 below the layer of the auxiliary electrode layer 13 can ensure the tight adhesion to the metal auxiliary electrode 13. On the contrary, in the case where the metal electrode 13 is directly formed on the resin substrate 11 on which the moisture-proof layer 15 is formed, there is a fear of the auxiliary electrode 13 being peeled from the resin substrate 11.

In this second embodiment, the transparent electrode 12 is formed, in form of film, on the auxiliary electrode 13 and is thereafter patterned. That is, in this embodiment, as shown in FIG. 3, the auxiliary electrode 13 is positioned between the resin substrate 11 and a portion of the transparent electrode 12. The transparent electrode 12 is formed in form of oxide film by, as like as in the first embodiment, carrying out the vacuum evaporation, spattering, ion-plating or epitaxial growth process or treatment and then patterning the thus formed oxide film.

As mentioned above, after the formation and patterning of the auxiliary electrode 13, the transparent electrode 12 is also formed in form of film and then patterned, so that there is no fear of eroding the transparent electrode 12, which was formed at a low temperature for the resin substrate, by the etching solution at the time of the patterning of the auxiliary electrode 13. Because of this advantage, the surface of the transparent electrode 12 can be kept smooth and the fine luminescent state of the luminescent layer can be also maintained. Moreover, since the metal auxiliary electrode 13 is covered by the transparent electrode 12 formed from the metal oxide, the oxidation of the auxiliary electrode 13 can be prevented.

Further, although not shown, a luminescent layer, a cathode layer and a sealing layer will be formed on the transparent electrode 12 in this order as in the former embodiment.

Figure 4:
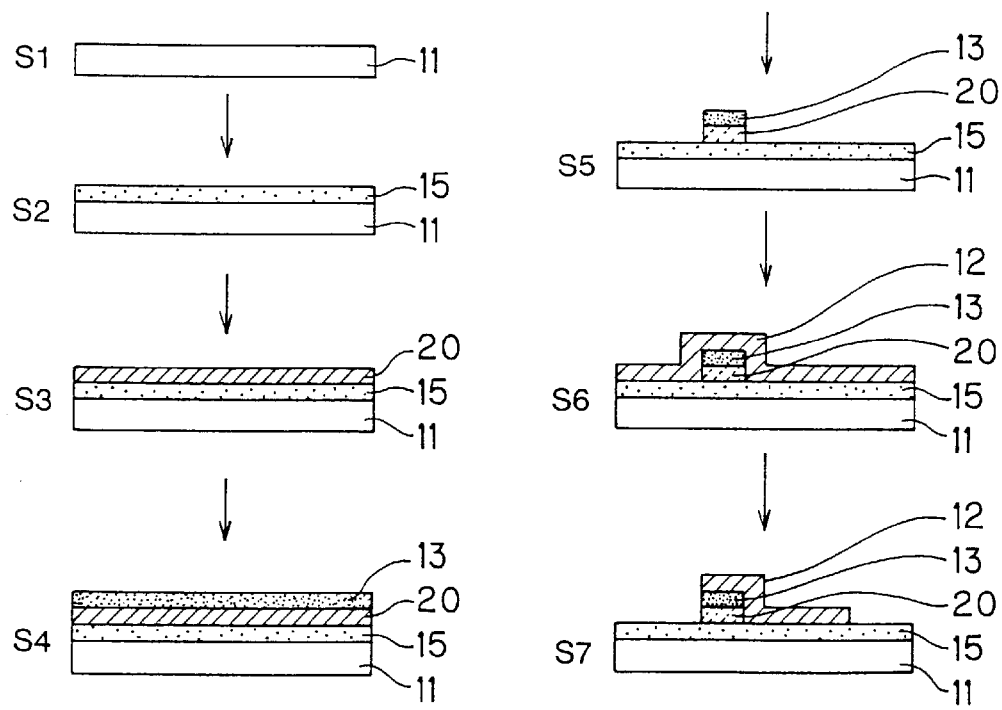
FIG. 4 includes several views representing a series of steps of manufacturing the luminescent display device of FIG. 3.

FIG. 4 includes several views representing the manufacturing steps of the luminescent display device of FIG. 2 of the second embodiment of the present invention.

First, the transparent resin substrate 11 is prepared (step S1). In the next step (step S2), a moisture-proof layer 15 is formed in form of film on at least one of the surfaces of the resin substrate 11 through the evaporation, spattering, ion-plating or epitaxial growth process or treatment. Thereafter, a layer of a metal oxide 20 is formed on the moisture-proof layer 15 through the spattering, ion-plating or epitaxial growth process or treatment (step S3), and in the next step (step S4), the auxiliary electrode 13 is formed on the metal oxide layer 20 in form of film through the evaporation, spattering, ion-plating, epitaxial growth process or treatment. In this film formation process (step S4), the film formation is carried out so that the total stress S (inner stress $\sigma(dyn/cm^2) \times$ film thickness d) of the metal thin film is not more than $1.3 \times 10^5$ dyn/cm.

In the next step (step S5), the auxiliary electrode 13 and the metal oxide 20 are subjected to the patterning treatment together by utilizing the photolithography technology. The transparent electrode 12 is then formed in form of film on the surface of the auxiliary electrode 13 through the spattering, ion-plating or epitaxial growth process or treatment (step S6), and the thus formed transparent electrode 12 is then patterned by utilizing the photolithography technology or like (step S7). Next, a luminescent layer is formed in form of film on the transparent electrode 12 through the evaporation, spattering, spin-coat, screen printing or fine grain spraying treatment or like process. Finally, a metal electrode is formed on the luminescent layer through the evaporation treatment or spattering treatment or by utilizing the photolithography technology.

Hereunder, Examples according to the present invention and Comparative Example will be described.

EXAMPLE 1 OF THE INVENTION

A liquid crystal substrate having a basic component of commercially sold polycarbonate PC, having thickness of 0.2 mm, was prepared, and silicon nitride oxide films were formed, as moisture-proof layers 15, 15, on both the surface of the substrate. A transparent electrode 12 was formed thereon and then patterned. On the thus formed transparent electrode 12, copper-palladium silver alloy was spattered at 5000 Å so as to form a film. The inner stress σ of this film was $1.1\times10^9$ dyn/cm$^2$, and accordingly, the total stress S was $S=(1.1\times10^9)\times(5000\times10^{-8})=5\times10^4$ dyn/cm. At the time of the formation of such metal thin film, there was not caused any problem due to the warpage of the resin substrate 11, and moreover, the moisture-proof layers 15, 15 and the transparent electrode 12 were not damaged by the stress.

Comparative Example 1

Figure 5A:
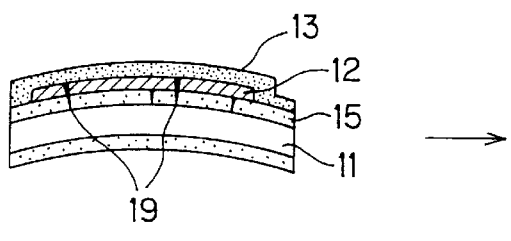
FIG. 5A shows a luminescent display device of a comparative example in a state just after formation of a metal thin film.
Figure 5B:
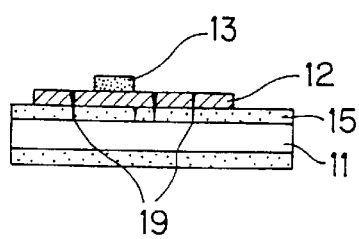
FIG. 5B shows a luminescent display device of a comparative example in a state after a patterning treatment effected to the metal thin film.
Figure 6:
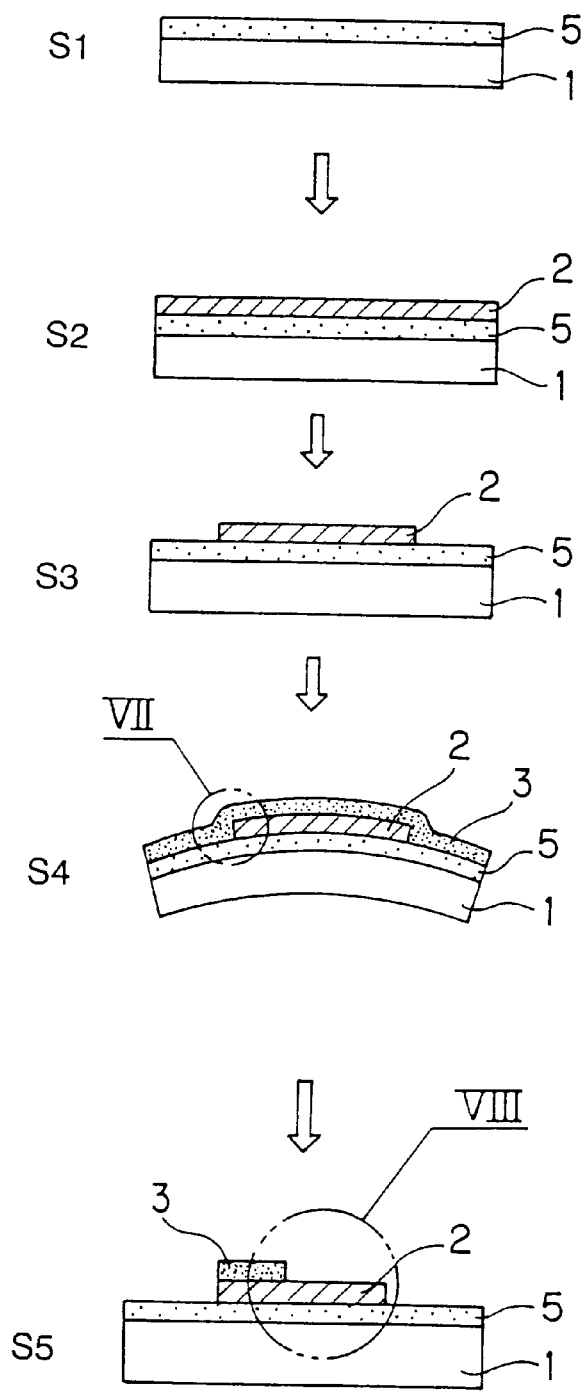
FIG. 6 includes several views representing a series of steps of manufacturing the luminescent display device having a conventional structure.
Figure 7:
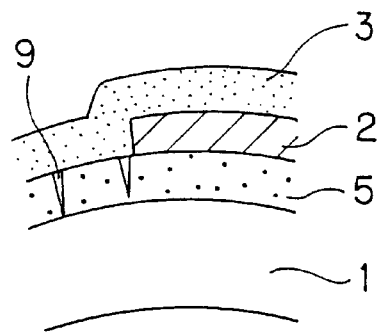
FIG. 7 is an enlarged view of a portion VII in FIG. 6.
Figure 8:
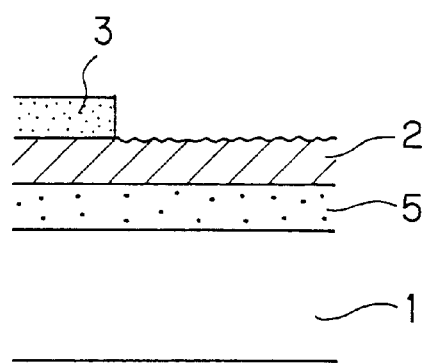
FIG. 8 is an enlarged view of a portion VIII in FIG. 6.

FIG. 5 represents a Comparative Example 1. With reference to FIG. 5, a liquid crystal substrate having a basic component of commercially sold polycarbonate PC, having thickness of 0.2 mm, was prepared, and silicon nitride oxide films were formed, as moisture-proof layers 15, 15, on both the surfaces of the substrate. A transparent electrode 12 was formed thereon and then patterned. On the thus formed transparent electrode 12, chromium (Cr) was spattered at 1000 Å so as to form a film. The inner stress o of this film was $15\times10^9$ dyn/cm$^2$, and accordingly, the total stress S was $S=(15\times10^9)\times(1000\times10^{-8})=1.5\times10^5$ dyn/cm. At the time of the formation of such metal thin film, the resin substrate 11 was largely warped as shown in FIG. 5A and cracks 19, 19—were generated to the moisture-proof layers 15, 15 and the transparent electrode 12 by the stress of the warpage, which were damaged. As shown in FIG. 5B, when the metal film 13 was patterned, the warpage was substantially reduced, but the cracks 19, 19—remained to the moisture-proof layers 15, 15 and the transparent electrode 12.

Comparative Example 2

A plurality of resin substrates to which moisture-proof layers 15, 15 were formed and metal films were then formed thereon. The formed metal films were of the materials shown in the following Table 2, which also show the inner stresses, film thicknesses and total stresses of these metal films.

With reference to the Table 2, in the case where the total stress exceeded the value of $1.3\times10^5$ dyn/cm, the resin substrate 11 provided a large warpage and/or the moisture-layer 15 (which shown in Table 2 as barrier layer) was damaged, thus providing a problem.

TABLE 2

| Material | Inner Stress (dyn/cm$^2$) | Film Thickness (nm) | Total Stress (dyn/cm) | Warpage of Substrate | Damage of Barrier Layer | Evaluation |
|---|---|---|---|---|---|---|
| Ag—PdCuAlloy (Ag:Pd(0.9 wt %):Cu(1.0 wt %) | $1.1\times10^9$ | 150 | $1.7\times10^4$ | Small | Not damaged | Good |
| Ag—PdCuAlloy | $1.1\times10^9$ | 500 | $5.5\times10^4$ | Small | Not Damaged | Good |
| Chromium | $1.5\times10^{10}$ | 100 | $1.5\times10^5$ | Large | Damaged | Not good |
| Molybdenum | $2.5\times10^{10}$ | 100 | $2.5\times10^5$ | Large | Damaged | Not good |
| Aluminium | $1.9\times10^9$ | 150 | $2.8\times10^4$ | Small | Not damaged | Good |

As can be seen from the above by way of Examples and Comparative Example, according to the present invention, a metal film having a small total stress of not more than $1.3\times10^5$ dyn/cm, at the time of preparing an organic EL element, was formed on the resin substrate, so that the warpage of the resin substrate can be prevented and the damage to the moisture-proof layer can be prevented from causing, which will provide merits at the time of pro-process or treatment such as patterning treatment.

It is to be noted that the present invention is not limited to the described embodiments and many other changes and modifications may be made without departing from the scopes of the appended claims.

The present application claims priority under 35 U.S.C §119 to Japanese Patent Application No. 2001-142066, filed on May 11, 2001 entitled "LUMINESCENT DISPLAY DEVICE AND METHOD OF MANUFACTURING SAME". The contents of that application are incorporated herein by reference in their entirety.

What is claimed is:

1. A luminescent display device comprising a resin substrate having one and another surfaces, and a transparent electrode, a metal auxiliary electrode disposed to be conductive to the transparent electrode and a luminescent layer composed of an organic compound, said transparent electrode, said auxiliary electrode and said luminescent layer being laminated in form of layers on the one surface of the resin substrate, wherein said auxiliary electrode has a total stress of {(inner stress)×(film thickness thereof)} of not more than $1.3\times10^5$ dyn/cm.

2. A luminescent display device according to claim 1, wherein a moisture-proof layer is disposed between the resin substrate and the transparent electrode so as to shut out moisture.

3. A luminescent display device according to claim 1 or claim 2, wherein said auxiliary electrode is disposed between the resin substrate and a portion of the transparent electrode.

4. A luminescent display device according to claim 3, wherein a layer of metal oxide is formed between the resin substrate and the auxiliary electrode.

5. A luminescent display device, comprising a resin substrate having one and another surfaces, and a transparent electrode, a metal auxiliary electrode disposed to be conductive to the transparent electrode and a luminescent layer composed of an organic compound, said transparent electrode, said auxiliary electrode and said luminescent layer being laminated in form of layers on the one surface of the resin substrate, wherein said auxiliary electrode is formed of silver or silver alloy in form of film having a thickness of not more than 500 nm.

6. A luminescent display device, comprising a resin substrate having one and another surfaces, and a transparent electrode, a metal auxiliary electrode disposed to be conductive to the transparent electrode and a luminescent layer composed of an organic compound, said transparent electrode, said auxiliary electrode and said luminescent layer being laminated in form of layers on the one surface of the resin substrate, wherein said auxiliary electrode is formed of aluminium in form of film having a thickness of not more than 150 nm.

7. A method of manufacturing a luminescent display device comprising the steps of:

preparing a resin substrate having one and another surfaces; and laminating, on the resin substrate, a transparent electrode, an auxiliary electrode made of metal to be conductive to the transparent electrode and a luminescent layer composed of an organic compound, wherein said auxiliary electrode is formed of metal in form of film having a total stress of $\{(\text{inner stress}) \times (\text{film thickness thereof})\}$ which is not more than $1.3 \times 10^5$ dyn/cm.

8. A manufacturing method according to claim 7, wherein said transparent electrode is laminated after the lamination of the auxiliary electrode.

9. A manufacturing method according to claim 8, further comprising a step of laminating a metal oxide on the one surface of the resin substrate before the formation of the auxiliary electrode.

10. A manufacturing method according to claim 7, wherein said auxiliary electrode is formed through either one process of vacuum evaporation, spattering, ion-plating or epitaxial growth and is then subjected to a patterning treatment.

* * * * *